United States Patent [19]

Schenk

[11] Patent Number: 5,230,012

[45] Date of Patent: * Jul. 20, 1993

[54] PROCESS AND CIRCUIT ARRANGEMENT FOR DIGITAL CONTROL OF THE FREQUENCY AND/OR PHASE OF SCANNING CLOCK PULSES

[75] Inventor: Heinrich Schenk, Munich, Fed. Rep. of Germany

[73] Assignee: Siemens Aktiengesellschaft, Berlin and Munich, Fed. Rep. of Germany

[*] Notice: The portion of the term of this patent subsequent to Nov. 12, 2008 has been disclaimed.

[21] Appl. No.: 400,293

[22] Filed: Aug. 29, 1989

[30] Foreign Application Priority Data

Aug. 30, 1988 [DE] Fed. Rep. of Germany ..... 88114139

[51] Int. Cl.$^5$ .............................................. H03D 3/24
[52] U.S. Cl. ..................... 375/111; 375/101
[58] Field of Search ............... 375/111, 110, 101, 106, 375/120, 99; 331/11, 12, 17, 18; 329/307; 364/724.2; 341/200, 155; 328/55

[56] References Cited

U.S. PATENT DOCUMENTS 4,389,616 6/1983 Göckler et al. ................... 375/99

FOREIGN PATENT DOCUMENTS 0092400 10/1983 European Pat. Off. .
3532857 3/1987 Fed. Rep. of Germany .

OTHER PUBLICATIONS

Unterrichtsblaetter der Deutschen Bundespost, vol. 34, 1981, No. 2, pp. 75-83.
Telcom Report, vol. 8 (1985), Special Issue, "Integrated Services Digital Network ISDN", pp. 22-27.

Primary Examiner—Curtis Kuntz
Assistant Examiner—Tesfaldet Bocure
Attorney, Agent, or Firm—Adel A. Ahmed

[57] ABSTRACT

Scanning samples of digital signals received in analog form are sent at intervals determined by the scanning clock pulses to a digital signal receiving network after analog-digital conversion for conversion of digital signals received in analog form. The respective digital signal receiving unit delivers control signals derived from the received digital signals. After filtering, these control signals are sent at predetermined intervals to a clock generator to deliver the scanning clock pulses. Filtering of the control signals takes place in the form $$Ta(i) = a1(Te(i)) - a2(Te(i-1)) + Ta(i-1),$$

where a1 and a2 denote a set of filter coefficients, $Ta(i)$ and $Ta(i-1)$ are filtered control signals at the times i and $(i-1)$ and $Te(i)$ and $Te(i-1)$ are control signals delivered at times i and $(i-1)$. The set of filter coefficients is fixed in accordance with the value of the instantaneous control signal deviation. The filtered control signals are then sent to the clock generator in quantized form.

23 Claims, 2 Drawing Sheets

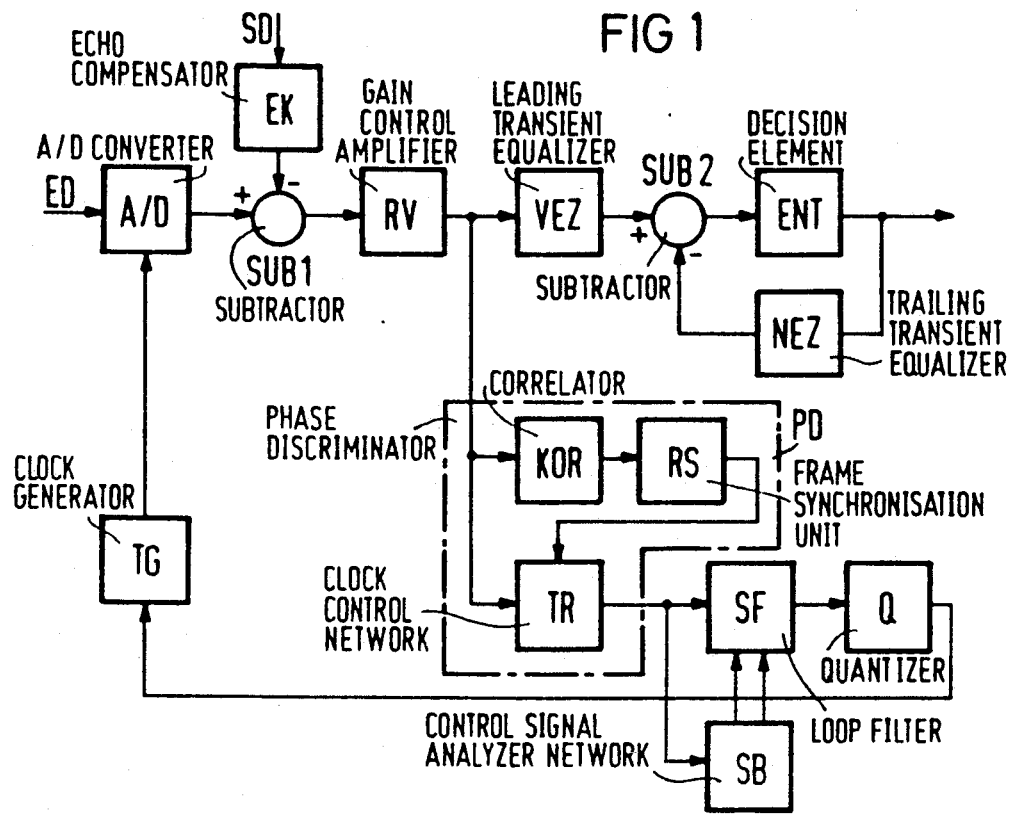
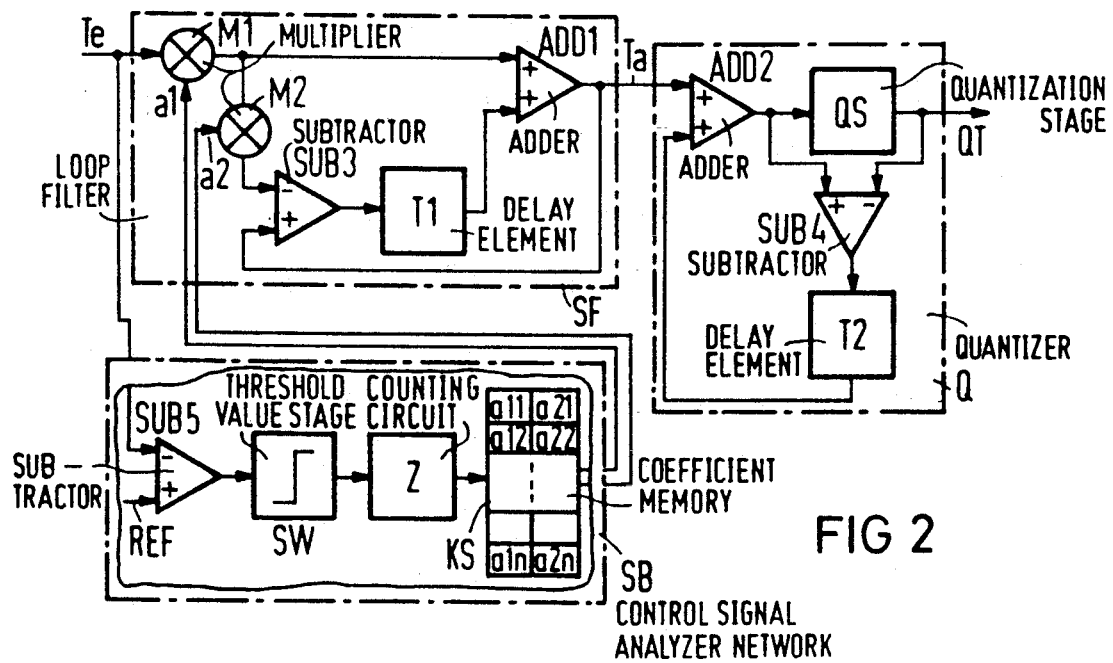

PROCESS AND CIRCUIT ARRANGEMENT FOR DIGITAL CONTROL OF THE FREQUENCY AND/OR PHASE OF SCANNING CLOCK PULSES

The present invention relates to a process and a circuit arrangement for digital control of the frequency and/or phase of scanning clock pulses.

Reference is also made to copending U.S. patent application Ser. No. 07/400,192, filed on the same date as the present application, entitled PROCESS AND CIRCUIT ARRANGEMENT FOR DIGITAL CONTROL OF THE PHASE OF SCANNING CLOCK PULSES, by the Inventor in the present Application, Heinrich Schenk, and which relates to a process and a circuit arrangement for digital control of the phase of scanning clock pulses.

A prior art process for digital control of the phase of scanning clock pulses in a subscriber's station circuit of an integrated services digital network is disclosed in Telcom Report, Vol. 8 (1985), Special Issue, "Integrated Services Digital Network ISDN", pp. 22–27. In this known subscriber's station circuit, scanning samples of digital signals received in analog form are sent after analog-digital conversion to a receiving element at intervals that are determined by the scanning clock pulses for conversion of the received digital signals. Then with the help of clock control and clocking, the circuitry of which will not be detailed here, the scanning clock pulses are derived from the received digital signals.

In addition, it is already known from Unterrichtsblätter der Deutschen Bundespost, Vol. 34, 1981, No. 2, pp. 75-83, that phase control circuits with a loop filter in the form of a low pass filter with a narrow bandwidth can be provided in digital transmission systems for clock recovery in order to suppress phase fluctuations (phase jitter) in the line signal caused by the transmission line. However, implementation of such a loop filter will not be detailed here.

A purpose of the present invention is to provide a simple method of filtering the control signals provided for frequency and/or phase control of scanning clock pulses.

In accordance with an aspect of the invention, a process for digital control of the frequency and/or phase of scanning clock pulses in a digital signal receiving system which receives scanning samples of digital signals received in analog form after analog-digital conversion whereby the scanning samples are received at fixed intervals determined by the scanning clock pulses where the received digital signals are converted, control signals derived from the received digital signals are supplied and sent at predetermined intervals after filtering to a clock generator for delivery of the scanning clock pulses is characterized in that filtering of the control signals is performed in the form $$Ta(i) = a1(Te(i) - a2(Te(i-1)) + Ta(i-1)$$

where $i = 1, \ldots, n$, and where a1, a2 denote a given set of filter coefficients, $Ta(i)$ and $Ta(i-1)$ are filtered control signals at the times i and $(i-1)$ and $Te(i)$ and $Te(i-1)$ are control signals supplied at the times i and $(i-1)$. At least two different sets of filter coefficients are selected according to the volume of the instantaneous control signal deviation, and the filtered control signals are sent to the clock generator in quantized form.

An advantage of the present invention is that the clock control system reaches a steady state rapidly and there is very little phase jitter in the steady state.

Phase jitter can be minimized, especially when quantization is performed without averaging with regard to the quantization error.

In addition, it is expedient that in a digital signal receiving element with an equalizing network that can be adjusted by a main equalizer coefficient and a number of equalizer coefficients preceding or following the latter, the equalizer coefficient immediately preceding or following the main equalizer coefficient, optionally weighted by a fixed factor, is added to the filtered control signals before quantization. By adding this equalizer coefficient to the filtered control signals, clock control is accomplished at a higher rate and without greatly increasing phase jitter.

In accordance with a further aspect of the invention, a circuit arrangement for carrying out the process referred to above with a digital signal receiving system which includes a clock control circuit comprising a phase discriminator and a clock generator that can be controlled by the latter, where the phase discriminator receives the scanning samples of received digital signals and derives control signals from these scanning samples and sends them to the clock generator at predetermined intervals through filter arrangement is characterized in that the filter arrangement supplies control signals in the form $$Ta(i) = a1(Te(i) - a2\ Te(i-1)) + Ta(i-1)$$

where $i = 1, \ldots, n$, and where a1 and a2 denote a set of filter coefficients, $Ta(i)$ and $Ta(i-1)$ denote filtered control signals at the times i and $(i-1)$ and $Te(i)$ and $Te(i-1)$ denote control signals supplied at the times i and $(i-1)$ by phase discriminator, so control signal analyzing circuit is connected to the filter arrangement and receives the control signals delivered by the phase discriminator and supplies one of at least two different sets of filter coefficients for the filter arrangement, depending on the instantaneous deviation in the amount of the control signals from a predetermined reference value, and the filtered control signals are sent to clock generator by way of a quantizer.

The advantages of this circuit include a low expenditure for circuitry required to implement the filter network as well as the systems connected to it.

The present invention will next be described in detail by way of an exemplary embodiment with reference to the drawing, in which FIG. 1 shows a digital signal receiving unit where the present invention is implemented;

FIG. 2 shows the design of a filter arrangement, a quantizer downstream therefrom as well as a control network connected to the filter arrangement as diagrammed only schematically in FIG. 1;

Figure 3:
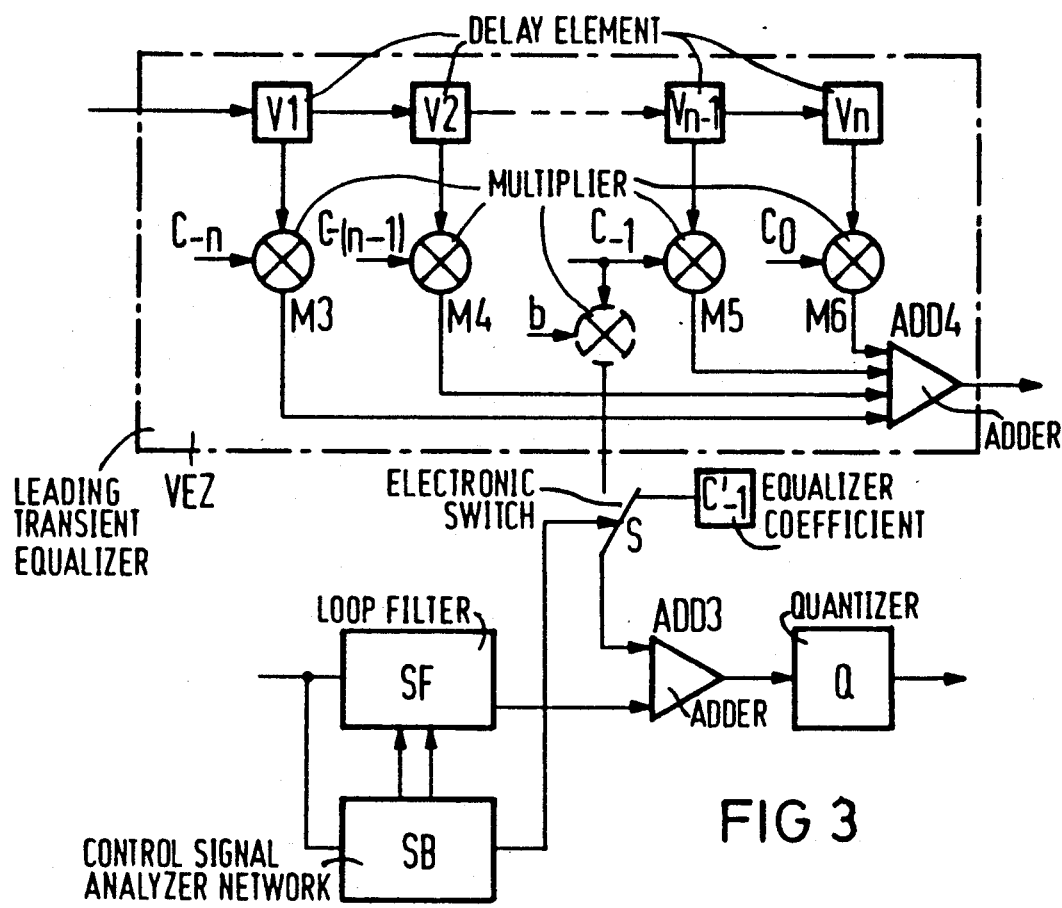
FIG. 3 shows an additional element connected between the filter arrangement and the quantizer.

The digital signal receiving system in FIG. 1 shows schematically the receiver of a subscriber's station circuit for the integrated services digital network ISDN. The subscriber's station circuit may be designed here for duplex transmission of digital signals over a two-wire line in the congruent band mode. For example, binary signals to be transmitted over the two-wire line as communications signals are first converted to multi-stage signals, e.g., three-stage signals by such a subscriber's circuit and after pulse shaping they are delivered as analog signals in a data block by way of a hybrid circuit. Such a data block which may comprise, for example, 120 bits also contains synchronization information in addition to the communications signals. In the present practical example a barker code word with a length of 11 bits has been selected as the synchronization information.

Analog signals picked up from the respective subscriber's circuit by way of the two-wire line first pass through the above-mentioned hybrid circuit and then go to the digital signal receiving system shown in FIG. 1. The input of this receiving system an analog-digital converter A/D which takes scanning samples from the digital signal supplied to it, e.g., at intervals corresponding to one bit length of the signals transmitted in a data block, and converts these scanning samples of the received analog signals to a 16-bit digital signal. The scanning clock pulses required for this are provided by a controllable clock generator TG.

The 16-bit digital signals are then sent in succession to a subtractor SUB1 which simultaneously receives compensation signals from an echo compensator EK. The echo signal components contained in the 16-bit digital signals are compensated with these compensation signals. With the delivery of data blocks over the two-wire line as described above, these echo signals are superimposed on the received analog signals due to reflection on this line or due to incomplete decoupling of the transmission paths of the hybrid circuit.

The compensated digital signals are then sent for further processing by way of an automatic gain control amplifier RV and an equalizer network which eliminates most of the distortion caused by the electrical properties of the two-wire line. The equalizer network has a leading transient equalizer VEZ, for example, whose output signals are applied to a subtractor SUB2. A second input of subtractor SUB2 is coupled to the output of a trailing transient equalizer NEZ. Equalizer NEZ is coupled at the input end to the output of a decision element ENT downstream from subtractor SUB2.

Details of the circuit parts of the digital signal receiving system diagrammed in FIG. 1 will not be given below because they are well known.

A phase discriminator PD, which derives the phase control signals from the signals supplied thereto such that the phase control signals are proportional to the prevailing control deviation, is coupled to the output of automatic gain control amplifier RV. In the present practical example, the phase discriminator has a correlator KOR that is coupled at the input end to the output of the automatic gain control amplifier RV and is connected at the output end to a frame synchronization network RS.

With the help of these two networks, frame clock pulses are derived from the signals occurring at the output of the automatic gain control amplifier RV and are applied together with the signals occurring at the output of automatic gain control amplifier RV to a clock control network TR. Clock control network TR derives therefrom control signals that are proportional to the prevailing control deviation during the reception of the above-mentioned synchronization information.

With regard to phase discriminator PD, it should also be pointed out that although one possible version has been described above, this version is not essential to the present invention. Instead, it is only assumed that the phase discriminator derives control signals that are proportional to the prevailing control deviation from the signals supplied to it. Thus, for example, it is also possible for the phase discriminator to derive the control signals directly from the received communications signals without synchronization information in a communications signal transmission over a two-wire line.

The control signals delivered by a phase discriminator PD generally contain some noise. To suppress this noise and thus to achieve low phase jitter, the control signals pass through a narrow band loop filter SF controlled by a control signal analyzer network SB. The filtered control signals are then applied to a quantizer Q, which provides 4-bit quantized control signals at its output which are also applied to the aforementioned controllable clock generator TG to control the frequency and/or phase of the scanning clock pulses. The clock generator may for this purpose have an adjustable clock divider, for example, that can be adjusted by the control signals supplied.

FIG. 2 shows a possible design of loop filter SF, quantizer Q and control signal analyzer circuit SB that is coupled to the loop filter. The loop filter has a multiplier M1 at the input end which receives the control signals TE supplied by phase discriminator PD and a filter coefficient a1. The resultant product signal goes to a first input of an adder ADD1 and also to an input of a multiplier M2 which receives a filter coefficient a2 at a second input. This output signal of multiplier M1 is applied to an input (−) of a subtractor SUB3. Another input (+) of this subtractor is connected to the output of adder ADD1.

The output of the subtractor SUB3 is applied to a second input of the adder ADD1 over a delay element T1 that may be designed as a storage element, for example, and whose time constant corresponds to the interval between two successive control signals.

The loop filter described here delivers control signals in the following form at its output: $Ta(i) = a1(Te(i) - a2 \cdot Te(i-1)) + Ta(i-1)$ where $i = 1, \ldots, n$, and where a1 and a2 denote a set of filter coefficients, $Ta(i)$ and $Ta(i-1)$ are control signals occurring at times i and (i−1) at the output of the loop filter and $Te(i)$ and $Te(i-1)$ are control signals supplied by the phase discriminator PD at the times i and (i−1).

The filtered control signals delivered by loop filter SF are applied to adder ADD2 of quantizer Q. The output of this adder is connected to a quantization stage QS which delivers 4-bit quantized control signals QT which are in turn applied to clock generator TG as explained above and also to one input of a subtractor SUB4. Another input of this subtractor is coupled to the input of quantization stage QS. Thus, an error signal that corresponds to the quantization error due to quantization appears at the output of the subtractor. This error signal is sent on to a delay element T2 which may be in the form of a memory, for example, and whose time constant corresponds to the interval between two successive quantized control signals. The output of this delay element is connected to a second input of the aforementioned adder ADD2. Thus, an error signal determined at time (i−1) is added to the filtered control signal occurring at time i. By this error signal feedback the quantization error due to the quantization is free of averaging.

FIG. 2 also shows a control signal analyzing network SB which receives the control signals delivered by phase discriminator PD. The value of these control signals is compared with a fixed reference value REF by a subtractor SUB5. If the value of a control signal is above the reference value, then a pulse with a first logic level, e.g., +1, is delivered at the output of a threshold value stage SW connected downstream from the subtractor. However, if the value of a control signal is below the reference value, a pulse with a second logic level, e.g., −1, appears at the output of the threshold value stage. The pulses of the first and second type are sent as counting pulses to a bidirectional (forward-/backward) counting circuit Z.

An impulse of the first type decrements the counter reading while an impulse of the second type increments the counter reading. The minimum counter reading and the maximum counter reading are fixed, e.g., at 0 and 63.

Output signals of counting circuit Z that correspond to counter readings are used as address signals in a coefficient memory KS. Filter coefficient sets a11, a21, ..., a1n, a2n are stored in memory cells assigned to these address signals in this coefficient memory. Of these filter coefficient sets, one set is selected at a given time in accordance with the address signal pending at that time and this set of filter coefficients is applied to loop filter SF as filter coefficient set a1, a2. For example, filter coefficients a21, ..., a2n can each be fixed at $2^{-4}$ whereas the filter coefficients a11, ..., a1n are selected according to the counter reading of counting circuit Z as shown in the following table.

| Counter reading | a1 |
| --- | --- |
| 0 ... 7 | a11 |
| 8 ... 31 | a12 = a11 × $2^{-3}$ |
| 32 ... 63 | a13 = a11 × $2^{-5}$ |
| 63 | a14 = a11 × $2^{-7}$ |

Providing a number of different filter coefficient sets depending on the control signal deviation ensures that the clock control circuit illustrated in FIG. 1 will rapidly reach a steady state. The loop filter described above is thus suitable for digital signal receiving systems where frequency control and/or phase control must be performed for scanning clock pulses.

In FIG. 3 an accessory element in the form of an adder ADD3 is connected upstream from the aforementioned quantizer Q. Loop filter SF is coupled to an input of this adder. A second input is coupled to an equalizer shown in FIG. 1 by way of a controllable electronic switch S. The equalizer may be the leading transient equalizer VEZ, for example. This leading transient equalizer is shown here as a known transverse filter with a number of delay elements V1 through Vn coupled in series. The outputs of these delay elements are each coupled to a multiplier (M3 to M6). With the help of these multipliers, the signals occurring at the outputs of the delay elements are each multiplied by an equalizer coefficient. The equalizer coefficient $C_0$ applied to multiplier M6 is the main equalizer coefficient. The individual product signals are then added up with the help of an adder ADD4.

The equalizer coefficient $C_{-1}$ immediately preceding the main equalizer coefficient $C_0$ is applied to adder ADD3. The size of this equalizer coefficient depends on the phase of the scanning clock pulses delivered by clock generator TG. The equalizer coefficient thus contains clock information that is utilized for more rapid clock control.

Switch S can be controlled by counting circuit Z belonging to the control signal analyzer network SB such that the switch applies the equalizer coefficient $C_{-1}$ further only when the counter reading of this counting circuit exceeds a predetermined counter reading. Before reaching this predetermined counter reading, however, a fixed $C'_{-1}$ is supplied to adder ADD3 as an equalizer coefficient. Thus, coupling between the clock control circuit and the equalizer is prevented in the rise time phase of the clock control circuit, i.e., when the control signal deviation is above a preset reference value, by means of this method of control of switch S.

Moreover, it should also be pointed out that instead of the leading transient equalizer VEZ a trailing transient equalizer NEZ may also be included in the clock control. In this case the equalizer coefficient $C_1$ directly following the main equalizer coefficient $C_0$ is supplied to the adder ADD3. In addition, as indicated in FIG. 3, an equalizer coefficient ($bC_{-1}$ or $bC_{+1}$) that is weighted by a given factor b can also be supplied to adder ADD3. The size and plus or minus sign of this factor determine any necessary matching to the clock control system. As an alternative, switch S may also be eliminated if the respective equalizer is activated for coefficient control when a predetermined counter reading of counter circuit Z is exceeded and up until this time the equalizer coefficients determined in a prior digital signal transmission are stored.

Figure 4:
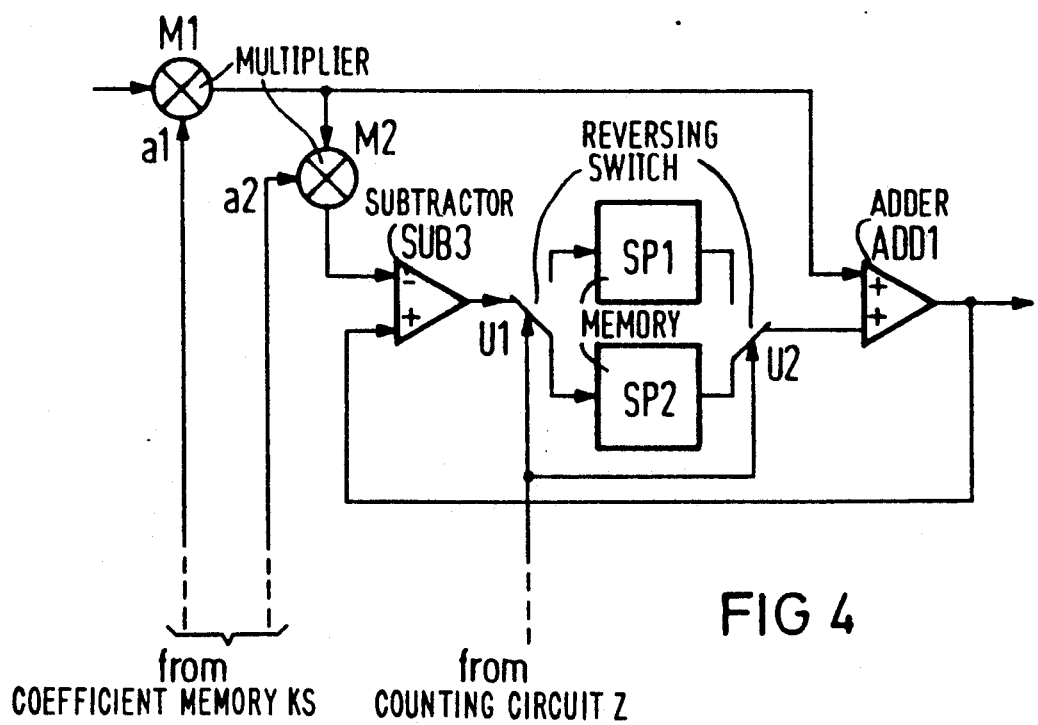
FIG. 4 shows another practical example of the filter arrangement illustrated in FIG. 1.

FIG. 4 shows a second practical example of loop filter SF illustrated in FIG. 2. In this example instead of delay element T1 there are two memories SP1 and SP2. These memories can be connected optionally between subtractor SUB3 and adder ADD1 by means of two reversing switches U1 and U2. The memory SP2 is connected when the counter reading of counting circuit Z (FIG. 2) is below a predetermined level, e.g., 32. In this condition a first set of filter coefficients a1, a2 is sent at the same time to loop filter SF. However, if the counter status of counting circuit Z is above the aforementioned predetermined value, memory SP1 is switched on and a second set of filter coefficients a1, a2 is supplied to the loop filter. In switching between memory SP1 and SP2 the value just contained in the respective memory remains stored. For example, another clock control can be initiated with this stored value in a subsequent digital signal transmission to the digital signal system diagrammed in FIG. 1.

The practical example of loop filter SF illustrated in FIG. 4, where only two different filter coefficient sets are utilized, can be used to advantage when the frequency ratios do not change significantly between two successive digital signal transmissions to a digital signal receiving system.

It should be noted that while the present invention has been described by way of the example of a digital signal receiving system for receiving digital signals over a two-wire line, the present invention can in general be used whenever control of the frequency and/or phase of scanning clock pulses must be performed in a digital signal receiving system with the help of a clock control circuit.

I claim:

1. A process for digital control of the frequency and-/or the phase of clock scanning pulses in a digital signal receiving system which receives input data signals in analog form and converts them to digital signals, comprising the steps of:

converting the input data signals in analog form to output digital signals at sampling intervals controlled by the clock scanning pulses;

determining phase deviations in the output digital signals and providing an output of control signals proportional thereto;

filtering the control signals according to the relation $$Ta(i) = a1(Te(i) - a2\ Te(i-1)) + Ta(i-1)$$

wherein $i = 1, \ldots, n$; $a1, a2$ are filter coefficients of one of at least two different sets of filter coefficients; $Ta(i)$ and $Ta(i-1)$ are filtered control signals at times $i$ and $(i-1)$; $Te(i)$ and $Te(i-1)$ are control signals supplied at the times $i$ and $(i-1)$ and wherein said one of the at least two different sets of filter coefficients is selected according to the instantaneous deviation in the value of the control signals from a predetermined reference value;

rendering an output of the filtered control signals in a quantized form; and using a clock generator for generating said clock scanning pulses having their phase controlled in accordance with the quantized filtered control signals.

2. A circuit arrangement for carrying out the process according to claim 1 with a digital signal receiving system which includes a phase discriminator and a clock generator that is controlled by the phase discriminator, where the phase discriminator receives digital signals and derives control signals from said digital signals and sends them back to the clock generator at predetermined intervals through a filter arrangement characterized in that the filter arrangement supplies control signals in the form $$Ta(i) = a1(Te(i) - a2\ Te(i-1) + Ta(i-1)$$

wherein $i = 1, \ldots, n$, and where $a1$ and $a2$ denote one of at least two different sets of filter coefficients, $Ta(i)$ and $Ta(i-1)$ denote filtered control signals at times $i$ and $(i-1)$ and $Te(i)$ and $Te(i-1)$ denote control signals supplied at the times $i$ and $(i-1)$ by the phase discriminator, in that a control signal analyzing network is coupled to the filter arrangement and receives the control signals delivered by the phase discriminator and supplies said one of the at least two different sets of filter coefficients for the filter arrangement depending on the instantaneous deviation in the value of the control signals from a predetermined reference value, and in that the filtered control signals are sent to the clock generator by way of a quantizer.

3. A circuit according to claim 2 wherein the control signal analyzing network includes a comparator circuit receiving said control signals and outputting comparator signals which indicate in each case whether a currently received control signal is above or below a predetermined threshold value, a bidirectional counter arrangement with a predetermined minimum and maximum count receiving said comparator signals as counting signals and sending output signals corresponding to the counter readings as address signals to a filter coefficient memory memorizing said sets of filter coefficient for said filter arrangement in accordance with the address signals.

4. Circuit according to claim 3 wherein the control signal analyzer network provides only two different sets of filter coefficients, wherein the filter arrangement includes two separate memories for storage of component control signals $a1 a2 Te(i-2) + Ta(i-1)$, wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

5. A circuit according to claim 3 wherein the quantizer has the input end an adder with two inputs, one of which receives the filtered control signals, and the adder is connected downstream to a quantization stage that forms the output of the quantizer and a feedback network which at time $i$ supplies an error signal that corresponds to a quantization error occurring at time $(i-1)$ to the input of the adder.

6. Circuit according to claim 5 wherein the control signal analyzer network provides only two different sets of filter coefficients, wherein the filter arrangement includes two separate memories for storage of component control signals $a1 a2 Te(i-2) + Ta(i-1)$, wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

7. A circuit according to claim 5 characterized in that a further adder with two inputs is connected between the filter and the quantizer in a digital signal receiving system with an equalizer circuit that can be adjusted by a main equalizer coefficient and a number of equalizer coefficients preceding and following it and one input of said further adder receives the filtered control signals while the other input receives the equalizer coefficient, optionally multiplied by a fixed factor, immediately preceding or following the main equalizer coefficient.

8. A circuit according to claim 7 characterized in that the equalizer coefficient is provided by way of a switch arrangement to said further adder on reaching a predetermined counter reading of the bidirectional counter arrangement belonging to the control signal analyzer network.

9. Circuit according to claim 8 wherein the control signal analyzer network provides only two different sets of filter coefficients, wherein the filter arrangement includes two separate memories for storage of component control signals $a1 a2 Te(i-2) + Ta(i-1)$, wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

10. Circuit according to claim 7 wherein the control signal analyzer network provides only two different sets of filter coefficients, wherein the filter arrangement includes two separate memories for storage of component control signals a1a2Te(i−2)+Ta(i−1), wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

11. A circuit according to claim 2 wherein the quantizer includes an adder with a first and a second input, which first receives the filtered control signals, a quantization stage connected to an output of the adder and forming an output of the quantizer and a feedback network connected to the quantization stage and supplying an error signal that corresponds to a quantization error occurring at time $i-1$ to said second input of the adder at time $i$.

12. A circuit according to claim 11 characterized in that a further adder with two inputs is connected between the filter and the quantizer in a digital signal receiving system with an equalizer circuit that can be adjusted by a main equalizer coefficient and a number of equalizer coefficients preceding and following it and one input of said further adder receives the filtered control signals while the other input receives the equalizer coefficient, optionally multiplied by a fixed factor, immediately preceding or following the main equalizer coefficient.

13. A circuit according to claim 12 characterized in that the equalizer coefficient is provided by way of a switch arrangement to said further adder on reaching a predetermined counter reading of the bidirectional counter arrangement belonging to the control signal analyzer network.

14. Circuit according to claim 13 wherein the control signal analyzer network provides only two different sets of filter coefficients, wherein the filter arrangement includes two separate memories for storage of component control signals a1a2Te(i−2)+Ta(i−1), wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

15. Circuit according to claim 12 wherein the control signal analyzer network provides only two different sets of filter coefficients, wherein the filter arrangement includes two separate memories for storage of component control signals a1a2Te(i−2)+Ta(i−1), wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

16. Circuit according to claim 11 wherein the control signal analyzer network provides only two different sets of filter coefficients, wherein the filter arrangement includes two separate memories for storage of component control signals a1a2Te(i−2)+Ta(i−1), wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

17. A circuit according to claim 2 wherein, in the case said digital signal receiving system comprises an equalizer circuit which equalizes said digital signals in such a way that one of said digital signals just being equalized and a predetermined number of said digital signals immediately preceding or following respectively said one of said digital signals are multiplied in each case by an equalizer coefficient associated therewith and that product signals resulting therefrom are added to form an equalized digital signal corresponding to said one of said digital signals; and a further adder with two inputs is connected between said filter arrangement and said quantizer, one input of the further adder receiving said filtered control signals while the other input of the further adder receives the equalizer coefficient associated with the digital signal immediately preceding or following respectively said one of said digital signals as input signal, which is optionally multiplied by a fixed factor.

18. A circuit according to claim 17 characterized in that the equalizer coefficient is provided by way of a switch arrangement to said further adder on reaching a predetermined counter reading of the bidirectional counter arrangement belonging to the control signal analyzer network.

19. Circuit according to claim 18 wherein the control signal analyzer network provides only two different sets of filter coefficients, wherein the filter arrangement includes two separate memories for storage of component control signals a1a2Te(i−2)+Ta(i−1), wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

20. Circuit according to claim 17 wherein the control signal analyzer network provides only two different sets of filter coefficients, wherein the filter arrangement includes two separate memories for storage of component control signals a1a2Te(i−2)+Ta(i−1), wherein a first memory and a first set of filter coefficients are included in forming a filtered control signal when the counter reading of the bidirectional counter arrangement is above a fixed value, but when the counter reading is below a fixed value the remaining memory and the remaining set of filter coefficients are included, and wherein when the memories are changed the component control signal contained at that moment in the respective memory remains stored.

21. A process according to claim 1 wherein, in the case said digital signal receiving system comprises an equalizer circuit which equalizes said digital signals in such a way that one of said digital signals just being equalized and a predetermined number of said digital signals immediately preceding or following respectively said one of said digital signals are multiplied in each case by an equalizer coefficient associated therewith and that product signals resulting therefrom are added to form an equalized digital signal corresponding to said one of said digital signals; and a further adder with two equalizer circuits, wherein the equalizer coefficient associated with the digital signal immediately preceding or following respectively said one of said digital signals is additionally used for said digital control of the frequency and/or the phase of clock scanning pulses by adding this equalizer coefficient to each of said filtered control signals whereby this equalizer coefficient is optionally multiplied by a fixed factor before said adding.

22. A process according to claim 1 further comprising the step of quantizing the filtered control signals in such a way that an average value of quantization errors which result from the difference of the filtered control signals and the quantized filtered control signals has a value of zero.

23. A process according to claim 22 further characterized in that an equalizer coefficient which immediately precedes or follows a main equalizer coefficient is multiplied by a fixed factor is supplied to the filtered control signals before quantization in a digital signal receiving system with an equalizer circuit that can be adjusted by the main equalizer coefficient and a number of equalizer coefficients immediately preceding or following the main equalizer coefficient.

* * * * *